(12) United States Patent
Kutsukake et al.

(10) Patent No.: US 8,681,556 B2
(45) Date of Patent: Mar. 25, 2014

(54) NON-VOLATILE SEMICONDUCTOR MEMORY DEVICE

(75) Inventors: Hiroyuki Kutsukake, Kanagawa (JP); Kikuko Sugimae, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/425,704

(22) Filed: Mar. 21, 2012

(65) Prior Publication Data

US 2013/0026566 A1  Jan. 31, 2013

(30) Foreign Application Priority Data

Jul. 27, 2011  (JP) ................................. 2011-163875

(51) Int. Cl.
*G11C 11/34* (2006.01)

(52) U.S. Cl.
USPC ............ 365/185.17; 365/189.17; 365/185.05; 365/51

(58) Field of Classification Search
USPC ...................... 365/51, 185.17, 185.05, 189.17
See application file for complete search history.

(56) References Cited

U.S. PATENT DOCUMENTS

| | | | | |
|---|---|---|---|---|
| 5,473,563 A | * | 12/1995 | Suh et al. ................. | 365/185.13 |
| 5,602,789 A | * | 2/1997 | Endoh et al. .............. | 365/185.03 |
| 6,002,162 A | * | 12/1999 | Takahashi et al. ............ | 257/544 |
| 6,888,769 B2 | * | 5/2005 | Kirsch .......................... | 365/205 |
| 6,894,341 B2 | | 5/2005 | Sugimae et al. | |
| 6,930,930 B2 | * | 8/2005 | Terletzki et al. ......... | 365/189.06 |
| 7,046,551 B2 | * | 5/2006 | Park et al. ................. | 365/185.17 |
| 7,245,534 B2 | * | 7/2007 | Goda et al. ............... | 365/185.17 |
| 7,259,977 B2 | * | 8/2007 | Takeyama et al. .............. | 365/63 |
| 7,486,565 B2 | * | 2/2009 | Edahiro .................... | 365/185.24 |
| 7,525,849 B2 | * | 4/2009 | Chen ......................... | 365/189.04 |
| 7,663,932 B2 | * | 2/2010 | Hamada et al. .......... | 365/185.25 |
| 7,995,405 B2 | * | 8/2011 | Akiyama et al. ......... | 365/189.15 |
| 8,159,884 B2 | * | 4/2012 | Honda ...................... | 365/189.06 |
| 8,400,837 B2 | * | 3/2013 | Edahiro .................... | 365/185.23 |
| 2004/0264246 A1 | * | 12/2004 | Sakui et al. ............... | 365/185.01 |

FOREIGN PATENT DOCUMENTS

JP  2008-258653  10/2008

OTHER PUBLICATIONS

U.S. Appl. No. 13/235,397, filed Sep. 18, 2011, Hiroyuki Kutsukake, et al.
U.S. Appl. No. 13/602,738, filed Sep. 4, 2012, Kutsukake.

* cited by examiner

*Primary Examiner* — Viet Q Nguyen

(74) *Attorney, Agent, or Firm* — Oblon, Spivak, McClelland, Maier & Neustadt, L.L.P.

(57) ABSTRACT

A non-volatile semiconductor memory device according to an embodiment includes: a p-type semiconductor substrate; a p-type first p well which is formed in the semiconductor substrate and in which a bit line connecting transistor configured to connect a bit line of a memory cell and a sense amplifier unit is formed; and an n-type first N well which surrounds the first P well and which is configured to electrically isolate the first P well from the semiconductor substrate.

10 Claims, 13 Drawing Sheets

FIG.5

| WIRING＼STATE | READ | WRITE | ERASE |
|---|---|---|---|
| SL | 0V | Vdd | floating |
| SGS | Vdd | 0V | floating |
| WL1 (SELECTED) | 0V | Vpgm | 0V |
| WL2~WLn (NON-SELECTED) | Vread | Vpass | 0V(*) |
| SGD | Vdd | Vdd | floating |
| BL1 (SELECTED) | Vbl | 0V | floating |
| BL2~BLm (NON-SELECTED) | Vbl | Vdd | floating |
| Sub(101) | 0V | 0V | 0V |
| P-well 1(102) | Vbb | Vbb | Vbb(+0.5V) |
| N-well (103) | 0V | 0V | Vbb(+0.5V) |
| Cell-P-well (106) | 0V | 0V | Vera |
| Cell-N-well (107) | 0V | 0V | Vera |

(*) Selected Block

NON-VOLATILE SEMICONDUCTOR MEMORY DEVICE

CROSS-REFERENCE TO RELATED APPLICATION

This application is based upon and claims the benefit of priority from Japanese Patent Application No. 2011-163875, filed on Jul. 27, 2011, the entire contents of which are incorporated herein by reference.

FIELD

Embodiments described herein relate generally to a non-volatile semiconductor memory device.

BACKGROUND

Conventionally, non-volatile semiconductor memory devices using semiconductor devices such as EEPROMs, AND-type flash memories, NOR-type flash memories and NAND-type flash memories are widely known. With the NAND-type flash memories among these, each memory cell shares a source/drain diffusion layer, and is suitable for a higher density.

At an end of a memory cell array of a NAND-type flash memory, a sense amplifier unit is provided which detects and amplifies data of a memory cell read from a bit line. Further, upon an erase operation of a memory cell in which a high erase voltage is applied to a bit line, it is necessary to prevent this high erase voltage from being applied to a transistor of the sense amplifier unit. Hence, a bit line connecting transistor which controls a connected state and a non-connected state between a bit line and a sense amplifier unit is arranged between the bit line and the sense amplifier unit.

BRIEF DESCRIPTION OF THE DRAWINGS

FIG. 5 is a view illustrating an operation voltage of the non-volatile semiconductor device according to the embodiment;

DETAILED DESCRIPTION

A non-volatile semiconductor memory device according to the embodiment includes: a p-type semiconductor substrate; a p-type first well which is formed in the semiconductor substrate and in which a bit line connecting transistor configured to connect a bit line of a memory cell and a sense amplifier unit is formed; and an n-type second well which surrounds the first well and which is configured to electrically isolate the first well from the semiconductor substrate. In addition, the non-volatile semiconductor memory device according to the embodiment is a NAND-type flash memory.

The non-volatile semiconductor memory device according to the embodiment electrically isolates a P well of the bit line connecting unit at which the bit line connecting transistor is formed, from the p-type semiconductor substrate by means of a N well. By this means, it is possible to apply a negative potential to the P well of the bit line connecting unit.

Consequently, it is possible to suppress an inter-device leakage in the bit line connecting unit, and reduce a device isolation width of the bit line connecting unit. Consequently, it is possible to provide a non-volatile semiconductor memory device in which the bit line connecting unit is scaled down.

Figure 1:
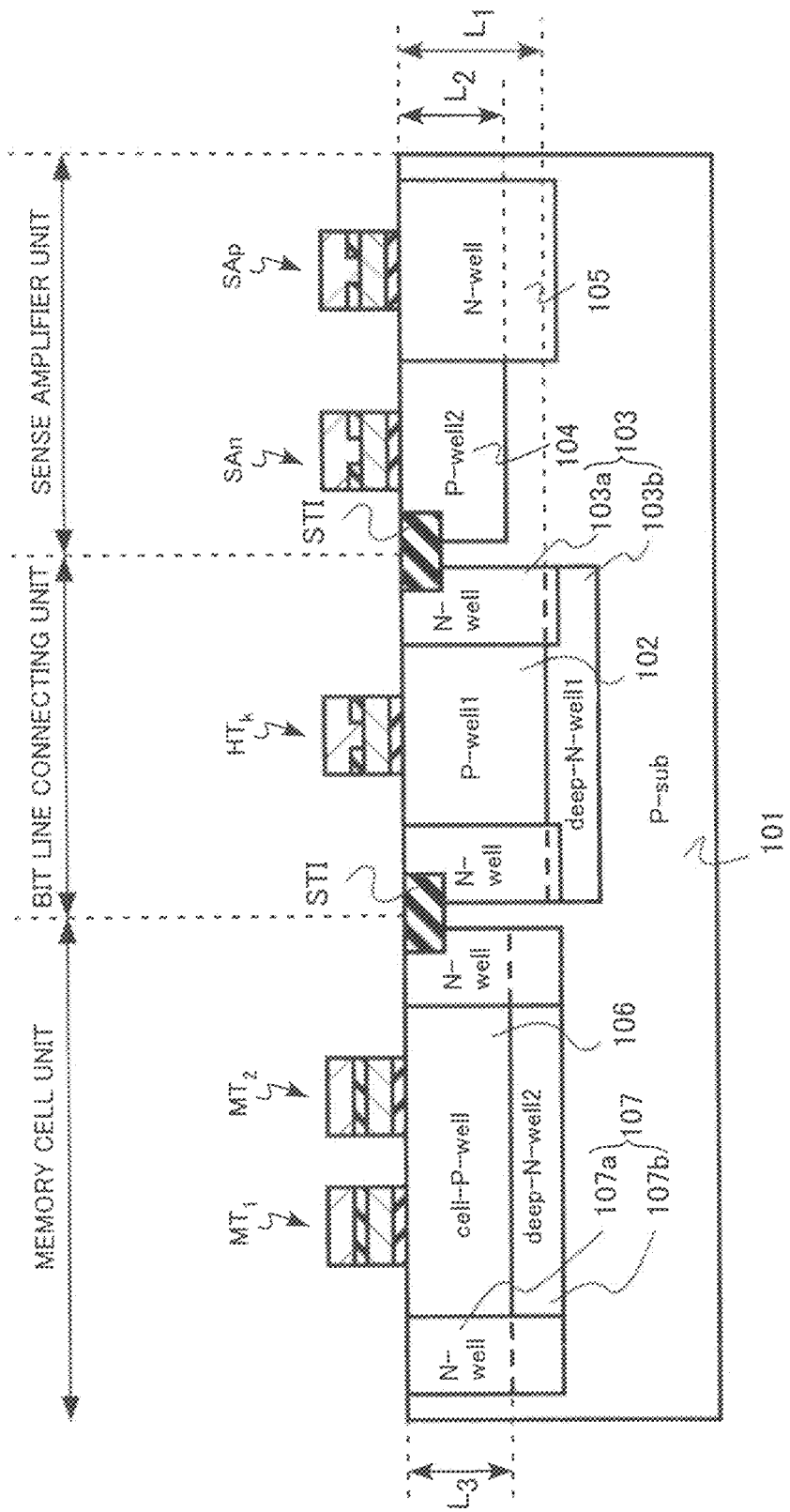
FIG. 1 is a schematic cross-sectional view of a non-volatile semiconductor memory device according to an embodiment.

FIG. 1 is a schematic cross-sectional view of a non-volatile semiconductor memory device according to the embodiment.

As illustrated in FIG. 1, the non-volatile semiconductor memory device is formed using a p-type semiconductor substrate (P-sub) 101. An impurity of the semiconductor substrate 101 is, for example, boron (B), and the impurity concentration is, for example, 1E14 to 1E16 atoms/cm$^3$.

Further, a p-type first P well (P-well1) 102 is formed in the p-type semiconductor substrate (P-sub) 101 corresponding to the bit line connecting unit. On the first P well 102, a bit line connecting transistor $HT_k$ is formed which connects a bit line of a memory cell and a sense amplifier unit. An impurity of the first P well 102 is, for example, boron (B), and the impurity concentration is, for example, 5E16 to 1E17 atoms/cm$^3$. In addition, in this description, when an impurity concentration of a well is distributed, a phrase "the impurity concentration of the well" simply means a peak concentration in this well.

Further, an n-type first N well 103 is formed which surrounds the first P well 102 and which electrically isolates the first P well 102 from the semiconductor substrate 101. The first N well 103 is formed with side regions (N-well) 103a and a bottom region (deep-N-well1) 103b.

An impurity of the first N well 103 is, for example, phosphorus (P) or arsenic (As), and the impurity concentration of the side regions (N-well) 103a is, for example, 5E17 to 1E18 atoms/cm$^3$ and the impurity concentration of the bottom region (deep-N-well1) 103b is, for example, 5E16 to 1E17 atoms/cm$^3$.

Thus, the bit line connecting unit is formed in a double well formed with the first P well 102 and the first N well 103.

Further, in the semiconductor substrate 101 corresponding to the sense amplifier unit, a p-type second P well (P-well 2) 104 is formed which is formed spaced apart from the first P well 102. On the second P well 104, an n-type transistor SAn of a sense amplifier is formed. An impurity of the second P well 104 is, for example, boron (B), and the impurity concentration is, for example, 5E17 to 1E18 atoms/cm$^3$.

Further, in the p-type semiconductor substrate 101 corresponding to the sense amplifier unit, an n-type second N well (N-well) 105 is formed. On the second N well 105, a p-type transistor SAp of the sense amplifier is formed. An impurity of the second N well 105 is, for example, phosphorus (P) or arsenic (As), and the impurity concentration is, for example, 5E17 to 1E18 atoms/cm$^3$.

Further, in the p-type semiconductor substrate 101 corresponding to the memory cell unit, a p-type cell P well (cell-P-well) 106 is formed. On the cell P well 106, memory cell transistors $MT_1$ and $MT_2$ are formed. An impurity of the cell P well 106 is, for example, boron (B), and the impurity concentration is, for example, 5E17 to 1E18 atoms/cm$^3$.

Further, a third N well 107 is formed which surrounds the cell P well 106 and which electrically isolates the cell P well 106 from the semiconductor substrate 101. The third N well 107 is formed with side regions (N-well) 107a and a bottom region (deep-N-well2) 107b.

An impurity of the third N well 107 is, for example, phosphorus (P) or arsenic (As), and the impurity concentration of the side regions (N-well) 107a is, for example, 5E17 to 1E18 atoms/cm$^3$ and the impurity concentration of the bottom region (deep-N-well1) 107b is, for example, 5E16 to 1E17 atoms/cm$^3$.

Thus, the memory cell unit is formed in a double well formed with the cell P well 106 and the third N well 107.

Figure 2:
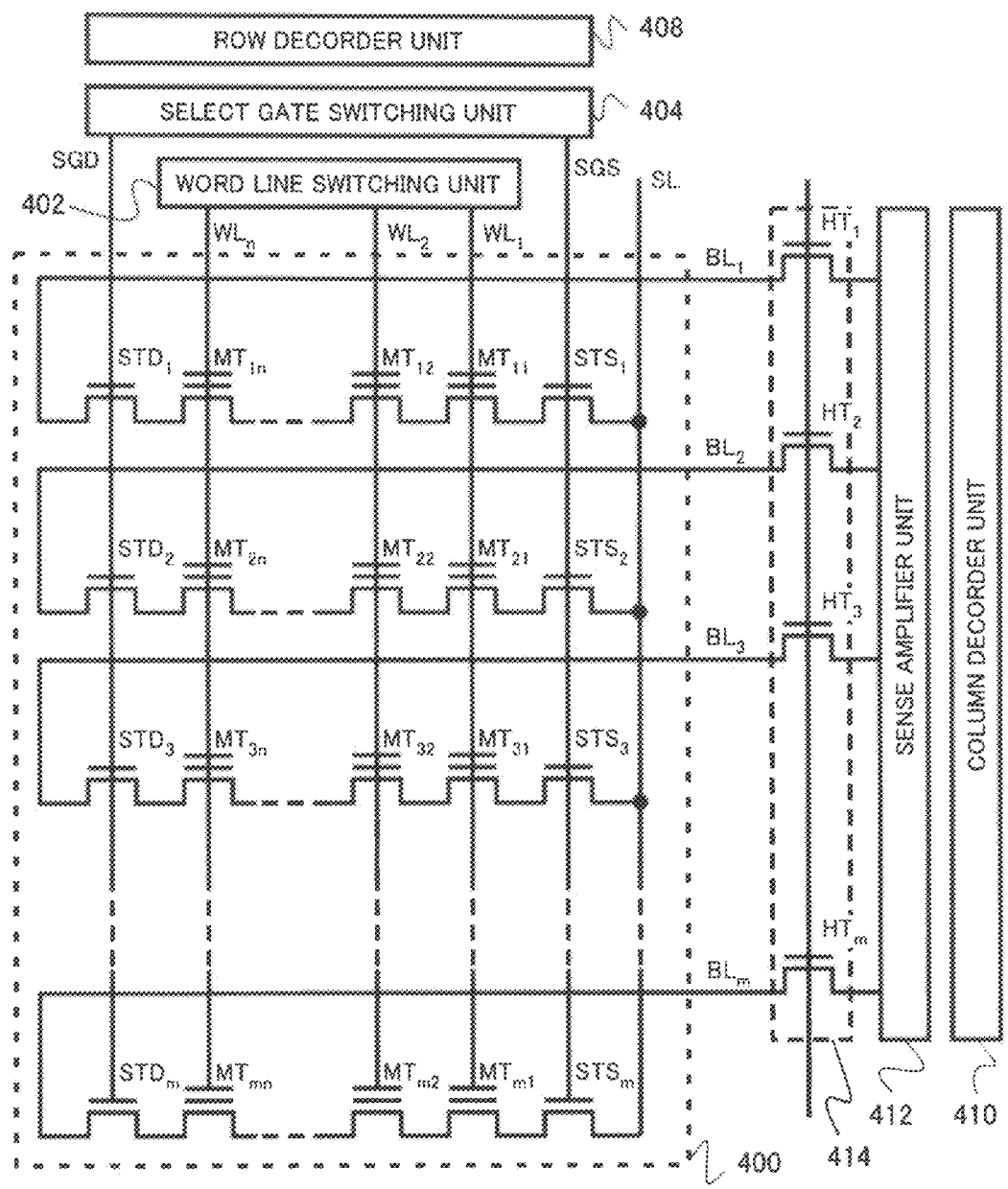
FIG. 2 is a circuit diagram of the non-volatile semiconductor memory device according to the embodiment.

FIG. 2 is a circuit diagram of the non-volatile semiconductor memory device according to the embodiment. As illustrated in FIG. 2, a memory cell array 400 is formed with memory cell transistors $MT_{11}$ to $MT_{1n}$, $MT_{21}$ to $MT_{2n}$, ... and $MT_{m1}$ to $MT_{mn}$ which are m×n (m and n are integers) MIS transistors. By aligning these memory cell transistors in a column direction and in a row direction, a plurality of memory cell transistors are arranged in a matrix pattern in the memory cell array 400.

In the memory cell array 400, for example, the memory cell transistors $MT_{11}$ to $MT_{1n}$ and select gate transistors $STS_1$ and $STD_1$ are connected in series to form a NAND string which is a cell unit.

A source region of the memory cell transistor $MT_{11}$ positioned at the end of alignment of a group of the memory cell transistors $MT_{11}$ to $MT_{1n}$ connected in series is connected with a drain region of the select gate transistor $STS_1$ which selects the memory cell transistors $MT_{11}$ to $MT_{1n}$. Further, a drain region of the memory cell transistor $MT_{1n}$ positioned at the end of alignment of a group of the memory cell transistors $MT_{11}$ to $MT_{1n}$ connected in series is connected with the source region of the select gate transistor $STD_1$ which selects the memory cell transistors $MT_{11}$ to $MT_{1n}$.

Select gate transistors $STS_2$ to $STS_m$, the memory cell transistors $MT_{21}$ to $MT_{2n}$, ..., and $MT_{m1}$ to $MT_{mn}$ and select gate transistors $STD_2$ to $STD_m$ are also connected in series likewise to form NAND strings.

Sources of the select gate transistors $STS_1$ to $STS_m$ are connected with a common source line SL.

Word lines $WL_1$ to $WL_n$ of the memory cell transistors $MT_{11}$, $MT_{21}$, ... and $MT_{m1}$, the memory cell transistors $MT_{12}$, $MT_{22}$, ..., $MT_{m2}$, and ... and the memory cell transistors $MT_{1n}$, $MT_{2n}$, ... and $MT_{mn}$ are connected to word line switch transistors of the word line switching unit 402.

The word lines $WL_1$ to $WL_n$ are respectively connected to, for example, a booster circuit through the word line switching unit 402. Further, the word line switching unit 402 controls an operation voltage to be applied to gate electrodes of the word lines WL1 to WLn.

The common select gate line SGS of the select gate transistors $STS_1$ to $STS_m$ and the common select gate line SGD of the select gate transistors $STD_1$ to $STD_m$ are connected to transistors of the select gate switching unit 404. The select gate switching unit 404 controls the operation voltage to be applied to the gate electrodes of the select gate transistors STS1 to STSm.

Further, the word lines $WL_1$ to $WL_n$, the select gate line SGS and the select gate line SGD are connected to a row decoder 408 through the word line switching unit 402 and the select gate switching unit 404. The row decoder 408 decodes a row address signal and obtains a row address decode signal to control gate voltages of the transistors of the word line switching unit 402 and the select gate switching unit 404.

Drains of the select gate transistors $STD_1$ to $STD_m$ are respectively connected with bit lines $BL_1$ to $BL_m$. A column decoder 410 obtains a column address signal and selects one of the bit lines $BL_1$ to $BL_m$ based on the column address decode signal.

A sense amplifier unit 412 amplifies data read through the bit lines $BL_1$ to $BL_m$ through memory cell transistors selected by the row decoder 408 and the column decoder 410.

Further, a bit line connecting unit 414 is provided between the memory cell array 400 and the sense amplifier unit 412. In the bit line connecting unit 414, bit line connecting transistors $HT_1$ to $HT_m$ are arranged which control a connected state and a non-connected state between the bit lines $BL_1$ to $BL_m$ and the sense amplifier unit. The bit lines $BL_1$ to $BL_m$ are connected to the bit line connecting transistors $HT_1$ to $HT_m$, respectively.

The bit line connecting unit 414 is provided to prevent a high erase voltage from being applied to the transistor of the sense amplifier unit 412 upon the erase operation of a memory cell in which the high erase voltage is applied to a bit line.

Figure 3:
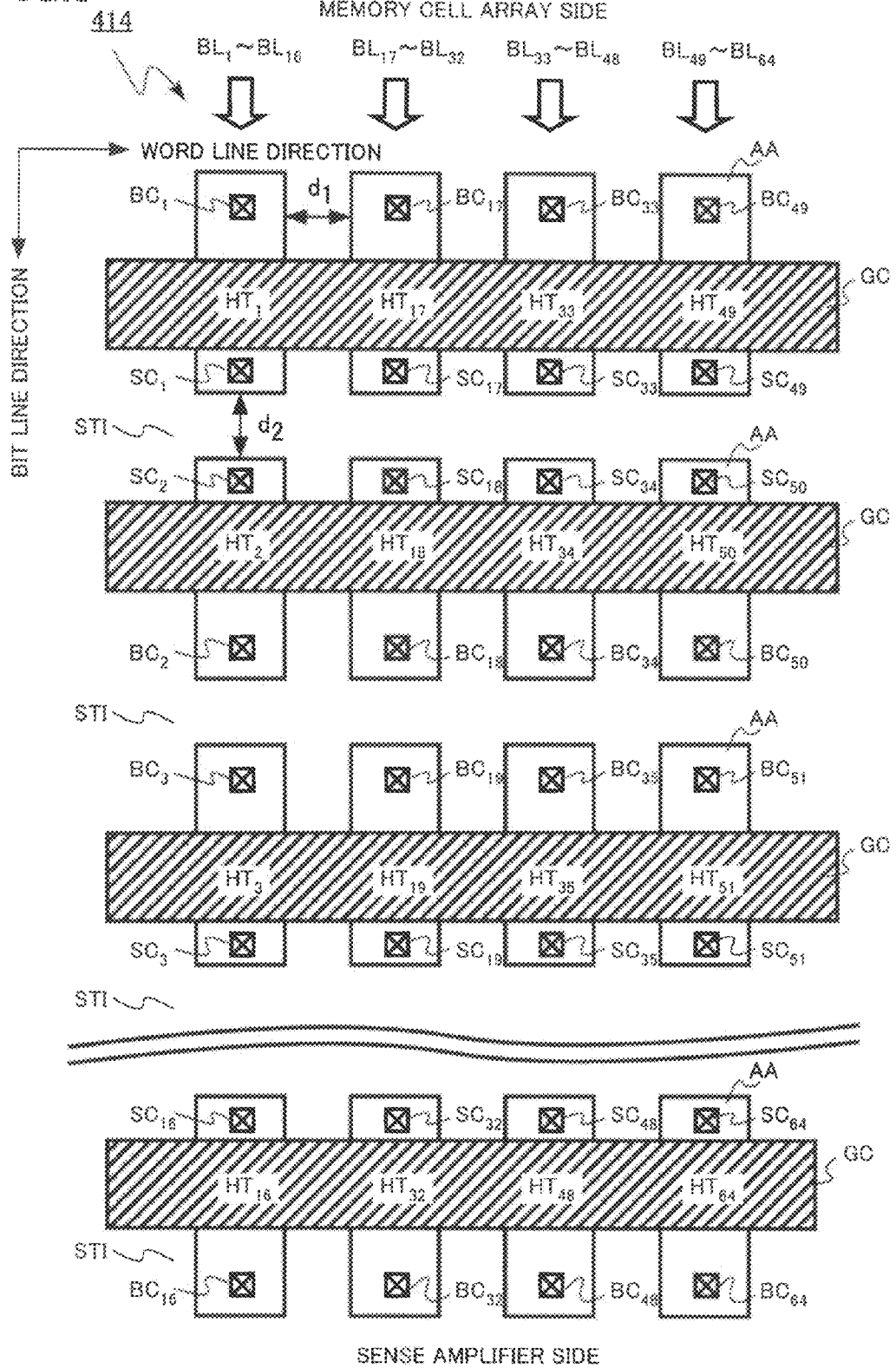
FIG. 3 is a view illustrating an example of a pattern layout of a bit line connecting unit according to the embodiment.

FIG. 3 is a view illustrating an example of a pattern layout of the bit line connecting unit 414. FIG. 3 illustrates a pattern where rectangular regions are device regions AA of bit line connecting transistors, and shaded regions are a pattern of gate electrodes GC of the bit line connecting transistors. Further, a region between the device regions AA is a device isolating region STI.

As is clear from FIG. 2, one bit line connecting transistor is provided for one bit line. However, the pitch between bit lines is very narrow, and therefore it is difficult to arrange one bit line connecting transistor for one bit line in the word line direction (the direction vertical to the bit lines).

Hence, as illustrated in, for example, FIG. 3, a plurality of bit lines are grouped, and a plurality of bit line connecting transistors connected to the bit lines belonging to this group are arranged in one line in the bit line direction toward the sense amplifier unit.

FIG. 3 illustrates an example where sixteen bit lines are grouped as one group and sixteen bit line connecting transistors are arranged in the bit line direction. Further, sixteen bit line connecting transistors of another group is arranged to be adjacent in the word line direction. For example, the bit line connecting transistors $HT_1$ to $HT_{16}$ connected to the bit lines $BL_1$ to $BL_{16}$ are arranged in the bit line direction, and the bit line connecting transistors $HT_{17}$ to $HT_{32}$ connected to the bit lines $BL_{17}$ to $BL_{32}$ are arranged adjacent to the bit line connecting transistors $HT_1$ to $HT_{16}$ in the word line direction. This layout allows connection of one bit line connecting transistor for one bit line, and arrangement of these bit line connecting transistor and bit line.

In addition, the bit line connecting transistor $HT_k$ (k=1 to 64) in FIG. 3 is connected to a bit line $BL_k$ in an upper layer wiring (not illustrated) through a memory cell array side contact $BC_k$, and is connected with the sense amplifier unit 412 in the upper layer wiring (not illustrated) through a sense amplifier unit side contact $SC_k$.

As described above, it is demanded to scale down a bit line connecting unit in which multiple bit line connecting transistors are arranged in order to provide a more highly dense memory chip. According to the embodiment, the bit line connecting unit 414 is formed in the double well, so that it is possible to independently set the potential of the well on the negative side. That is, it is possible to set the well potential of the first P well 102 less than 0 V. Consequently, it is possible to suppress a leakage current between devices, and reduce an inter-device distance, that is, an device isolation width.

Specifically, the layout illustrated in FIG. 3 can shorten the distance represented by $d_1$ or $d_2$ in FIG. 3. By shortening the distance represented by $d_1$, it is possible to increase, for example, the number of the bit line connecting transistors which can be arranged in the word line direction. Consequently, it is possible to reduce the number of transistors which need to be grouped. As a result, it is possible to reduce the width of the bit line connecting unit 414 in the bit line direction. Further, by shortening the distance represented by $d_2$, it is possible to reduce the width of the bit line connecting unit 414 in the bit line direction even if the number of transistors which need to be grouped does not change.

Figure 4:
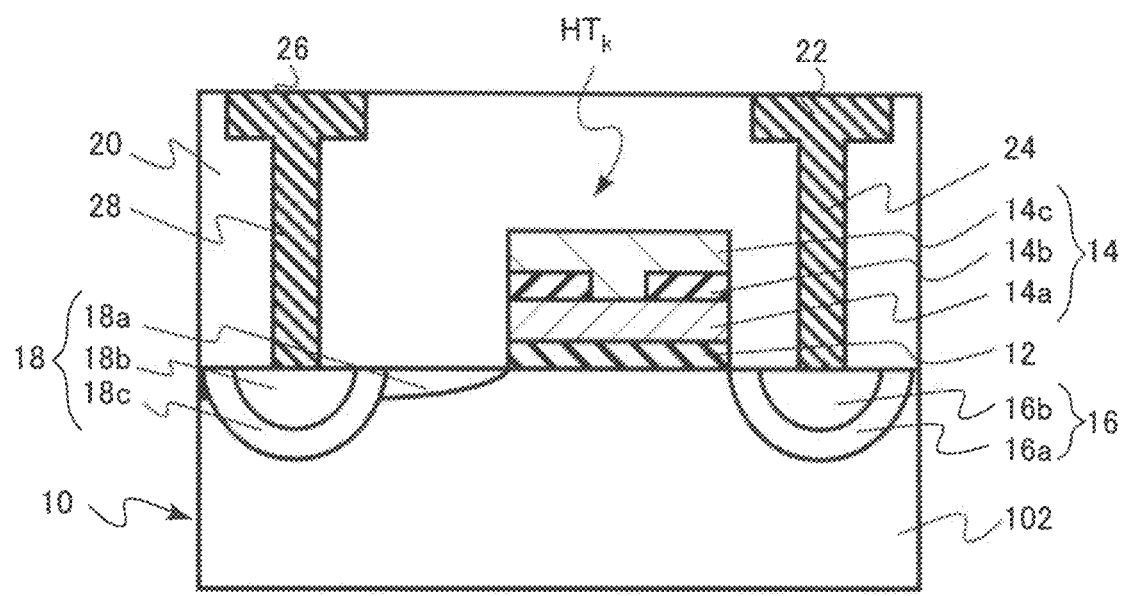
FIG. 4 is a schematic cross-sectional view of a bit line connecting transistor in a gate length direction according to the embodiment.

FIG. 4 is a schematic cross-sectional view of a bit line connecting transistor in a gate length direction according to the embodiment.

The bit line connecting transistor $HT_k$ has a gate insulating film 12 formed on the first P well 102 in the semiconductor substrate 10, a gate electrode 14 formed on the gate insulating film 12, and a first source/drain region 16 and a second source/drain region 18 provided to sandwich a gate electrode.

The semiconductor substrate 10 is, for example, silicon. Further, the gate insulating film 12 is, for example, a silicon oxide film. The gate electrode 14 has, for example, the same layered structure as the word lines of the memory cells. The gate electrode 14 is formed with, for example, a charge storage film 14a of polycrystalline silicon, a block insulating film 14b formed with a layered film of, for example, a silicon oxide film, a silicon nitride film and a silicon oxide film, and a control gate electrode film 14c formed with a layered film of, for example, polycrystalline silicon and nickel silicide conducting with the charge storage film 14a through an opening provided in the block insulating film 14b.

Materials of the semiconductor substrate 10, the gate insulating film 12 and the gate electrode 14 are by no means limited to the above-described materials. For example, other materials such as a layered film of polycrystalline silicon and cobalt silicide, a layered film of polycrystalline silicon and tungsten silicide, a layered film of polycrystalline silicon and nickel silicide, a tungsten film and a tungsten nitride film may be used for the control gate electrode film 14c.

The first source/drain region 16 has a first n-type impurity layer 16a and a second n-type impurity layer 16b which has a higher impurity concentration than and is not deeper than the first n-type impurity layer 16a.

The first n-type impurity layer 16a is an n-type diffusion layer containing, for example, phosphorus (P) as an impurity. The impurity concentration of the first n-type impurity layer 16a is, for example, about 1E18 atoms/$cm^3$ to 1E20 atoms/$cm^3$.

The second n-type impurity layer 16b is formed spaced apart farther from the gate electrode 14 than the first n-type impurity layer 16a, and surrounded by the first n-type impurity layer 16a. The second n-type impurity layer 16b is an $n^+$ type diffusion layer containing, for example, arsenic (As) as an impurity. The impurity concentration of the second n-type impurity layer 16b is, for example, about 1E19 atoms/$cm^3$ to 1E21 atoms/$cm^3$.

Thus, the first source/drain region 16 adopts a so-called DDD structure. The "DDD (Double Diffused Drain) structure" in this description is a form of a MISFET (Metal Insulator Semiconductor Field Effect Transistor) source/drain structure, and means a structure having two impurity layers of a $n^+$ impurity layer and an $n^-$ impurity layer which surrounds this $n^+$ impurity layer and has a lower impurity concentration than the $n^+$ impurity layer.

Further, the second source/drain region 18 has a third n-type impurity layer 18a which has a lower impurity concentration than and is not deeper than the first n-type impurity layer 16a, and a fourth n-type impurity layer 18b which has a higher impurity concentration than and is deeper than the third n-type impurity layer 18a. In addition, the second source/drain region 18 has a fifth n-type impurity layer 18c which has a lower impurity concentration than and is deeper than the fourth n-type impurity layer 18b.

The third n-type impurity layer 18a is an n-type diffusion layer containing, for example, phosphorus (P) as an impurity. The impurity concentration of the third n-type impurity layer 18a is, for example, about 1E17 atoms/$cm^3$ to 1E19 atoms/$cm^3$.

The fourth n-type impurity layer 18b is formed spaced apart farther from the gate electrode 14 than the third n-type impurity layer 18a. The fourth n-type impurity layer 18b is an $n^+$ type diffusion layer containing, for example, arsenic (As) as an impurity. The impurity concentration of the fourth n-type impurity layer 18b is, for example, about 1E19 atoms/$cm^3$ to 1E21 atoms/$cm^3$.

The fifth n-type impurity layer 18c is formed spaced apart farther from the gate electrode 14 than the third n-type impurity layer 18a, and is formed to surround the fourth n-type impurity layer 18b. The fifth n-type impurity layer 18c is an n-type diffusion layer containing, for example, phosphorus (P) as an impurity. The impurity concentration of the fifth n-type impurity layer 16a is, for example, about 1E18 atoms/$cm^3$ to 1E20 atoms/$cm^3$.

Thus, the second source/drain region 18 adopts a so-called LDD structure. The "LDD (Lightly Doped Drain) structure" in this description is a form of a MISFET source/drain structure, and means a structure having two impurity layers of a $n^+$ impurity layer and an $n^-$ impurity layer which is positioned closer to the gate electrode side than this $n^+$ impurity layer and has a lower impurity concentration than and is not deeper than the $n^+$ impurity layer.

On the gate electrode 14 and the semiconductor substrate 10, the inter-layer insulating film 20 is formed. The inter-layer insulating film 20 is, for example, a silicon oxide film.

A first contact electrode 24 is formed which penetrates the inter-layer insulating film 20 and connects the first source/drain region 16 and a first wiring 22. The first contact electrode 24 is a sense amplifier side contact $SC_k$ in FIG. 3. Further, a second contact electrode 28 is provided which connects the second source/drain region 18 and a second wiring 26. The second contact electrode 28 is a bit line side contact $BC_k$ in FIG. 3. The first wiring 22, the first contact electrode 24, the second wiring 26 and the second contact electrode 28 are made of, for example, tungsten (W).

The first source/drain region 16 is connected to the sense amplifier unit 412 through the first contact electrode 24 and the first wiring 22. Further, the second source/drain region 18 is connected to the bit line $BL_k$ through the second contact electrode 28 and the second wiring 26.

With the bit line connecting transistor $HT_k$ according to the embodiment, one of the source/drain regions adopts one DDD structure, and the other one of the source/drain regions adopts the LDD structure. One of the source/drain regions adopts the DDD structure, so that a parasitic resistance is reduced. Consequently, it is possible to secure high drive power when data in the bit line $BL_k$ is read. Further, the other one of the source/drain regions adopts the LDD structure, so that it is possible to secure surface breakdown voltage at a gate end when memory cell data is erased. Consequently, it is also possible to secure high reliability.

Next, a relationship of a potential upon an operation of memory cell data in the non-volatile semiconductor memory device according to the embodiment will be described. FIG. 5 is a view illustrating an operation voltage of the non-volatile semiconductor device according to the embodiment.

Meanwhile, in FIG. 5, Vdd is a power source voltage and is, for example, 1 to 4 V. Vpgm is a write voltage and is, for example, 13 to 26 V. Vread is a read voltage, and is higher than Vdd and is, for example, 2 to 9 V. Vpass is a midpoint voltage and is, for example, 3 to 13 V. Vbl is a precharge voltage and is, for example 0.5 to 1 V. Vbb is a substrate (well) voltage and is, for example, −0.5 V. Further, Vera is an erase voltage and is, for example, 13 to 26 V.

As illustrated in FIG. 5, upon an erase operation of memory cell data, the erase voltage Vera of a high voltage is applied to the cell P well 106 and third N well (cell N well) 107 of the memory cell unit. Further, this voltage is applied to the bit lines $BL_1$ to $BL_m$.

Figure 6:
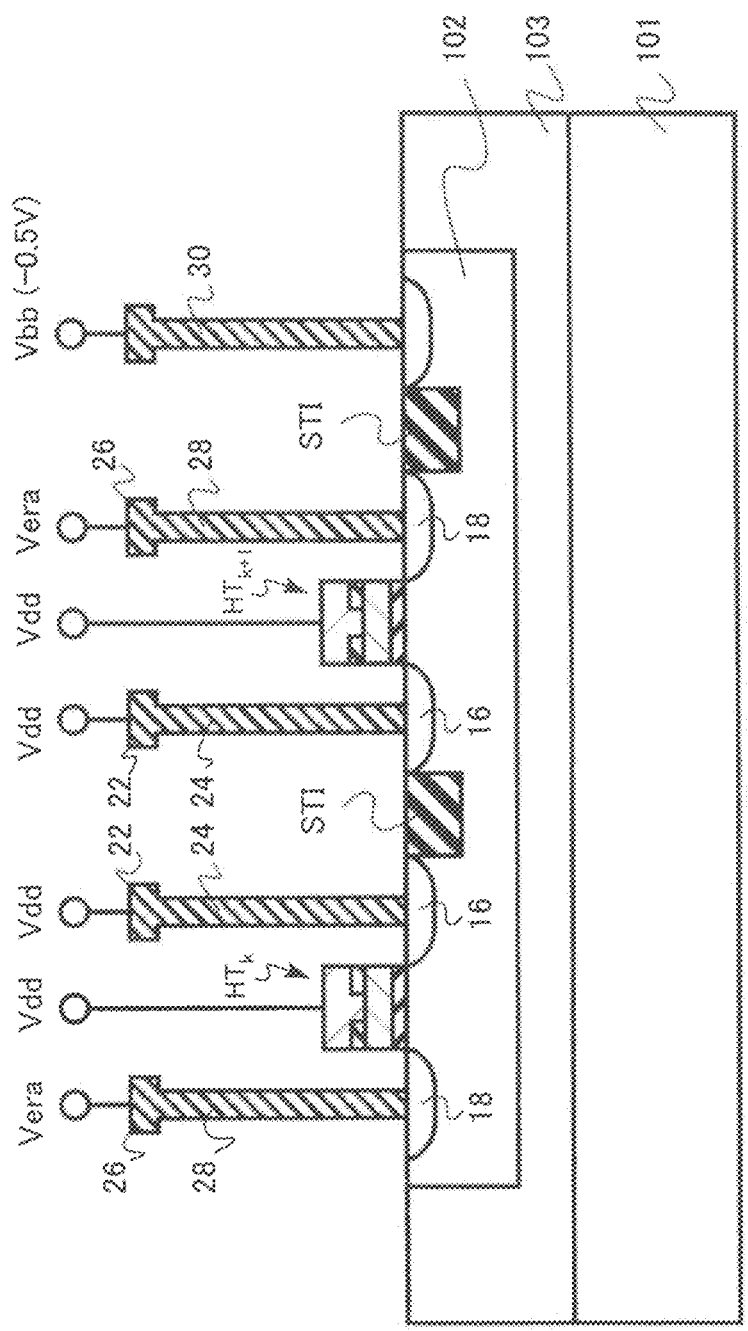
FIG. 6 is a view illustrating a relationship of a potential upon an operation of the bit line connecting transistor according to the embodiment.
Figure 7:
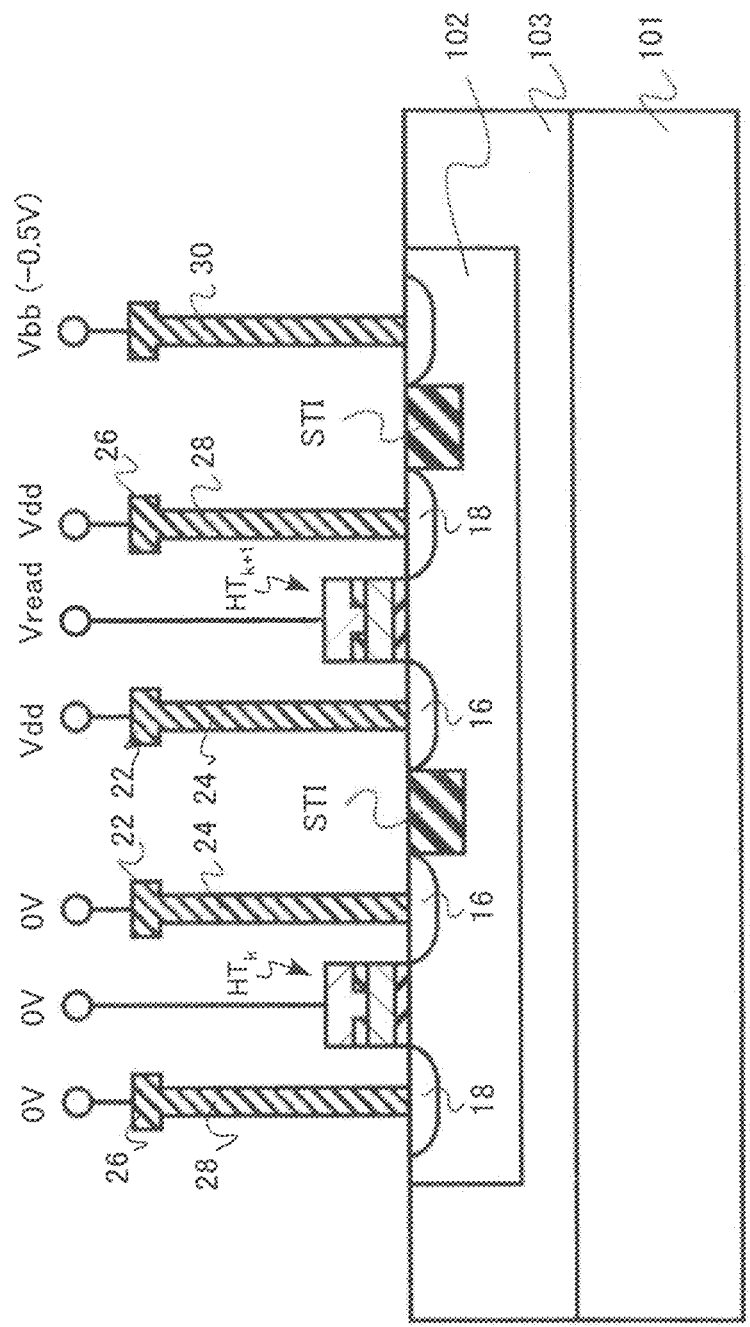
FIG. 7 is a view illustrating a relationship of a potential upon an operation of the bit line connecting transistor according to the embodiment.

FIGS. 6 and 7 are schematic cross-sectional views illustrating a relationship of a potential upon an operation of the non-volatile semiconductor memory device according to the embodiment. FIG. 6 illustrates the relationship of the potential upon an erase operation, and FIG. 7 illustrates the relationship of the potential upon a read or write operation.

As described above, the second source/drain region 18 of the bit line connecting transistor $HT_k$ is connected to the bit line $BL_k$ through the second contact electrode 28 and the second wiring 26. Consequently, as described in FIG. 6, Vera is applied to the second source/drain region 18 upon the erase operation. By contrast with this, the first source/drain region 16 is connected to the sense amplifier unit 412 through the first contact electrode 24 and the first wiring 22.

Hence, the bit line connecting transistor $HT_k$ maintains an off state by applying, for example, the voltage Vdd to the gate electrode 14 such that the high voltage Vera is not applied to the sense amplifier unit upon the erase operation.

Consequently, upon the erase operation, a high electrical field is applied between the second source/drain region 18 and the first P well 102 and, particularly, to a gate electrode end. Therefore, there is a concern that a decrease in reliability occurs such as deterioration of the junction breakdown resistance of the second source/drain region 18 and an increase in a leakage current. Hence, the second source/drain region 18 side is requested to provide a higher surface breakdown resistance and suppress junction leakage.

By contrast with this, the voltage applied from the sense amplifier unit 412 to the first source/drain region 16 is Vdd. Consequently, upon the erase operation, a high voltage is not applied to the first source/drain region 16 unlike the second source/drain region 18.

Upon read or write, 0 V or Vdd is applied from the bit line $BL_k$ to the first source/drain region 16. Further, 0 V or Vdd is also applied from the sense amplifier unit 412 to the second source/drain region 18. For example, the voltage Vread is applied to the gate electrode 14 to maintain the on state. Consequently, as illustrated in FIG. 7, in both states, a high voltage upon the erase operation is not applied to the first source/drain region 16 and the second source/drain region 18.

In addition, a negative well potential (Vbb in FIGS. 6 and 7) is applied to the first P well 102 through the P well contact electrode 30. Vbb is, for example, −0.5 V.

Further, preferably, all devices of the bit line connecting unit are positioned in the double well formed with the first N well 103 and the first P well 102 from the view point of reduction in an area. Further, there are a plurality of P well contact electrodes 30 illustrated in FIGS. 6 and 7 in the single first P well 102.

Focusing on the above unique relationship of the potential upon the operation of the bit line connecting transistor $HT_k$, the source/drain structure is optimized in the bit line connecting transistor $HT_k$ according to the embodiment as illustrated in FIG. 4.

First, the DDD structure is adopted for the first source/drain region 16 to which a high voltage is not applied upon all read, write and erase operations. This makes it easy to increase the driving power, reduce the area of the source/drain region 16 and reduce a chip size.

That is, the impurity concentration of the first n-type impurity layer 16a which is the n⁻ type diffusion layer is made higher and is made deeper than the third n-type impurity layer 18a. By this means, it is possible to reduce the parasitic resistance of the n⁻ type diffusion layer and improve the driving power of the bit line connecting transistor $HT_k$.

Further, the LDD structure is adopted for the second source/drain region 18 to which a high voltage is applied upon the erase operation to improve the surface breakdown resistance on the second source/drain region 18 side.

That is, depletion upon the off state is promoted by making the third n-type impurity layer 18a an n⁻ type diffusion layer which has a lower impurity concentration and is not deeper, and the surface breakdown resistance is improved by increasing voltage falling in the n⁻ type diffusion layer.

The maximum voltage is applied between adjacent device regions of the bit line connecting unit 414 upon read or write illustrated in FIG. 7. That is, the potential of a bit line BL connected to an adjacent bit line connecting transistor HT is inverted, and the maximum voltage applied between device regions is Vdd. Upon the erase operation in FIG. 6, the potential between the most adjacent device regions is the same, so that inter-device leakage does not becomes severe.

Consequently, when data is read from a memory cell or when data is written in the memory cell, the potential of the first P well is preferably less than 0 V from the view point of improving the inter-device breakdown resistance and suppressing inter-device leakage.

Figure 8:
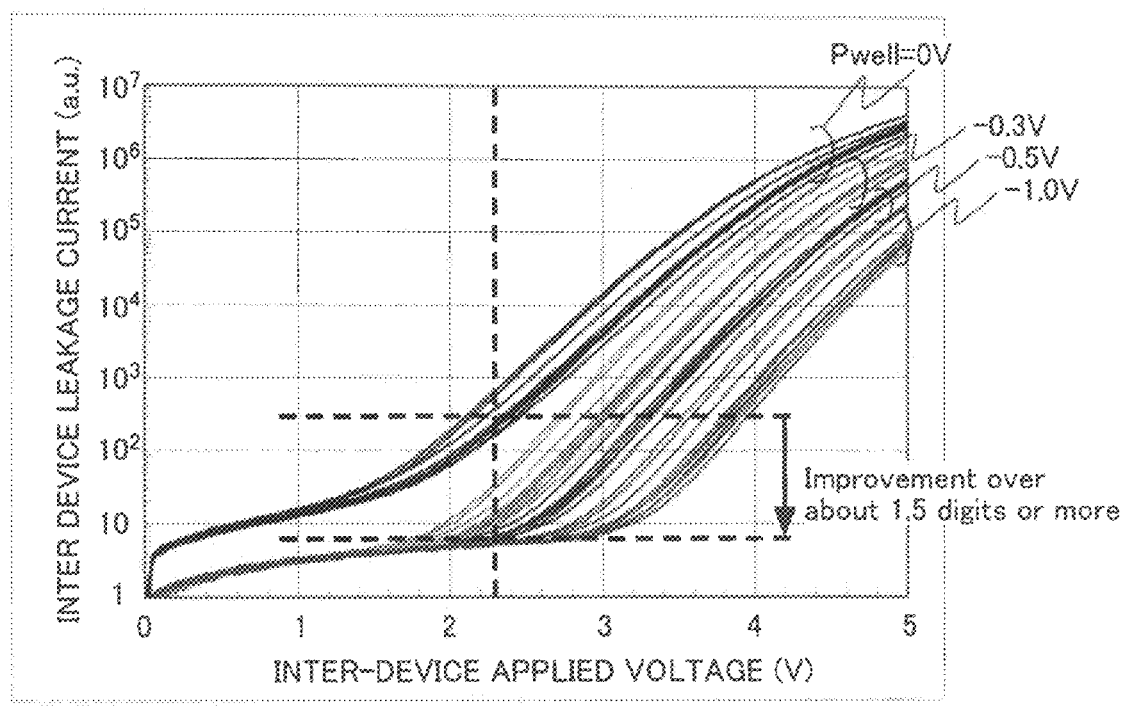
FIG. 8 is a view illustrating an evaluation result of well voltage dependency of an inter-device leakage current of the bit line connecting unit according to the embodiment.

FIG. 8 is a view illustrating an evaluation result of well potential dependency of an inter-device leakage current of the bit line connecting unit. Based on the layout pattern illustrated in FIG. 3, inter-device leakage between one bit line connecting transistor of interest such as $HT_{18}$ and surrounding bit line connecting transistors such as $HT_1$, $HT_2$, $HT_3$, $HT_{17}$, $HT_{19}$, $HT_{33}$, $HT_{34}$ and $HT_{35}$ is evaluated. $HT_{18}$ is placed in the on state, and an applied voltage Va for $SC_{18}$ and $BC_{18}$ is changed between 0 and 5 V. Device regions of $HT_1$, $HT_2$, $HT_3$, $HT_{17}$, $HT_{19}$, $HT_{33}$, $HT_{34}$ and $HT_{35}$ are fixed to 0 V. Further, the potential of the P well is changed to 0, −0.3 V, −0.5 V and −1.0 V. In addition, device isolation widths $d_1$ and $d_2$ are 0.3 μm.

As is clear from FIG. 8, in case of, for example, Va=2.3 V, if the potential of the P well is changed from 0 V to −0.5 V, the inter-device leakage current decreases over about 1.5 digits.

Consequently, the embodiment is very effective to reduce the device isolation width (inter-device distance) of the bit line connecting unit 414.

In addition, from the view point of improving the inter-device leakage current and the device isolation breakdown resistance, the well concentration of the first P well 102 in which the bit line connecting unit 414 is formed is preferably high. Hence, the impurity concentration of the first P well 102 is preferably higher than the impurity concentration of the semiconductor substrate 101.

As described above, upon the erase operation of a memory cell, the high voltage Vera is applied to the second source/drain region 18 of the bit line connecting transistor. Hence, from the view point of improving the surface breakdown resistance on the second source/drain region 18 side, the well concentration of the first P well 102 is preferably low. Consequently, the impurity concentration of the first P well 102 is preferably lower than the second P well 104 and the cell P well 106 in which a high voltage is not applied between the source/drain region and the well.

Further, from the view point of suppressing a punch through in the vertical direction between the second source/drain region 18 and the first N well 103 to which the high voltage Vera is applied, the depth of the first P well 102 ($L_1$ in FIG. 1) is preferably deeper than the depth of the second P well 104 ($L_2$ in FIG. 1) and the depth of the cell P well 106 ($L_3$ in FIG. 1).

Figure 9:
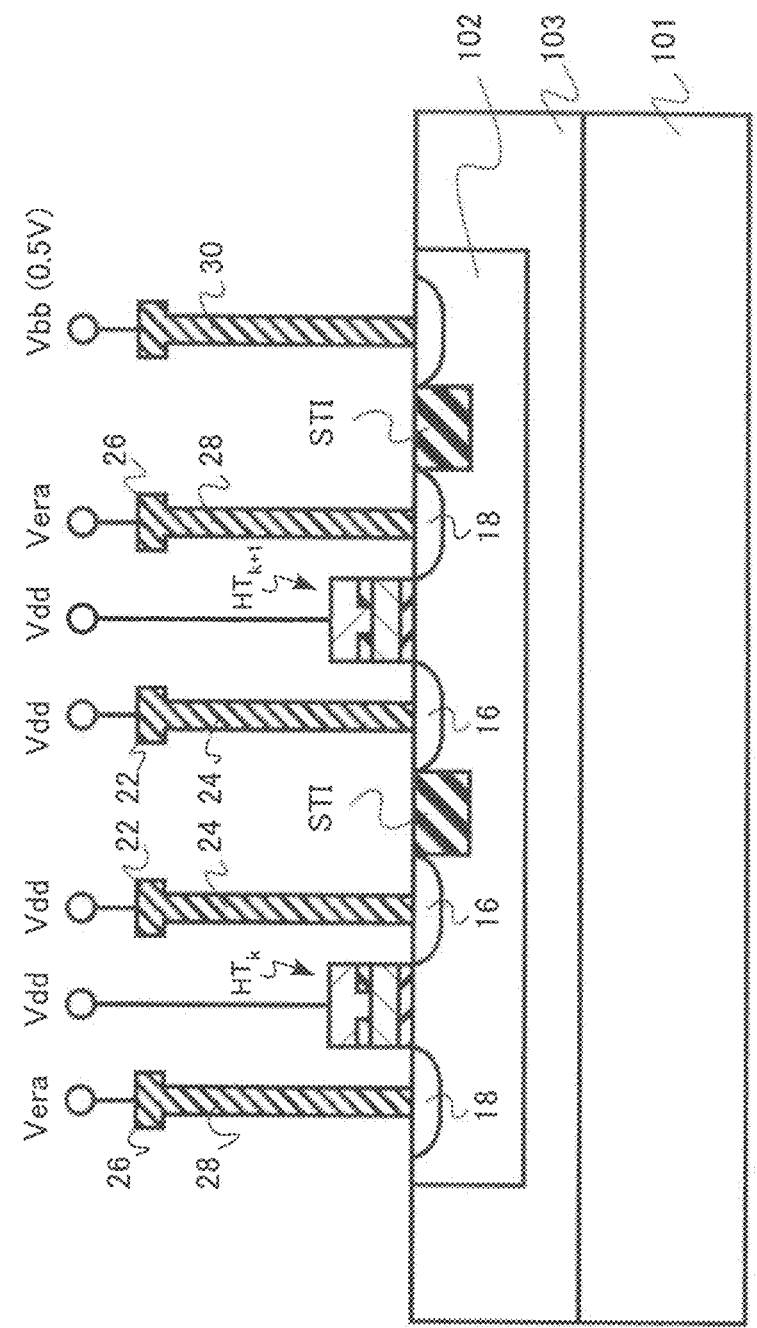
FIG. 9 is a view illustrating another relationship of a potential upon an erase operation of the bit line connecting transistor according to the embodiment.

FIG. 9 is a schematic cross-sectional view illustrating another relationship of a potential upon an erase operation of the non-volatile semiconductor memory device according to the embodiment.

From the view point of improving the surface breakdown resistance and reducing the junction leakage current upon the erase operation of a memory cell, the potential of the first P well (Vbb in FIG. 8) applied from the P well contact electrode 30 is preferably set to 0 V or more when data in the memory cell is erased, and is more preferably set higher than 0 V and to, for example, 0.5 V. By this means, upon the erase operation, the voltage applied between the second source/drain region 18 and the first P well 102 of the bit line connecting transistor is relaxed, so that it is possible to improve the surface breakdown resistance and reduce the junction leakage current.

In this case, the potential of the first N well 103 is maintained at, for example, the same potential as the potential of the first P well 102 such that junction is not carried out in a forward direction. Further, the potential of the semiconductor substrate 101 is fixed to, for example, 0 V.

For example, by additionally providing a well potential control unit which controls the potential of the first P well, it is possible to set the well potential to lower than 0 V when data in a memory cell is read or when data is written in the memory cell, and set the well potential to 0 V or more or to higher than 0 V when data in the memory cell is erased.

For example, similar to the bit line connecting unit 414, a row system core circuit such as the word line switching unit 402 illustrated in FIG. 2 is demanded to reduce an inter-device distance for miniaturization. For example, Vpgm which is set to a voltage higher than Vera is generally applied to the source/drain region of the transistor of the word line switching unit 402. Hence, the demand for the surface breakdown resistance and junction leakage is more likely to be severe for the source/drain region than the bit line connecting unit 414. Consequently, compared to the row system core circuit such as the word line switching unit 402, the bit line connecting unit 414 can be easily designed as in the embodiment to apply a negative voltage to the well or increase the well concentration.

Next, a non-volatile semiconductor memory device manufacturing method according to the embodiment will be described. FIGS. 10 to 13 are schematic cross-sectional views illustrating the non-volatile semiconductor memory device manufacturing method according to the embodiment.

Figure 10:
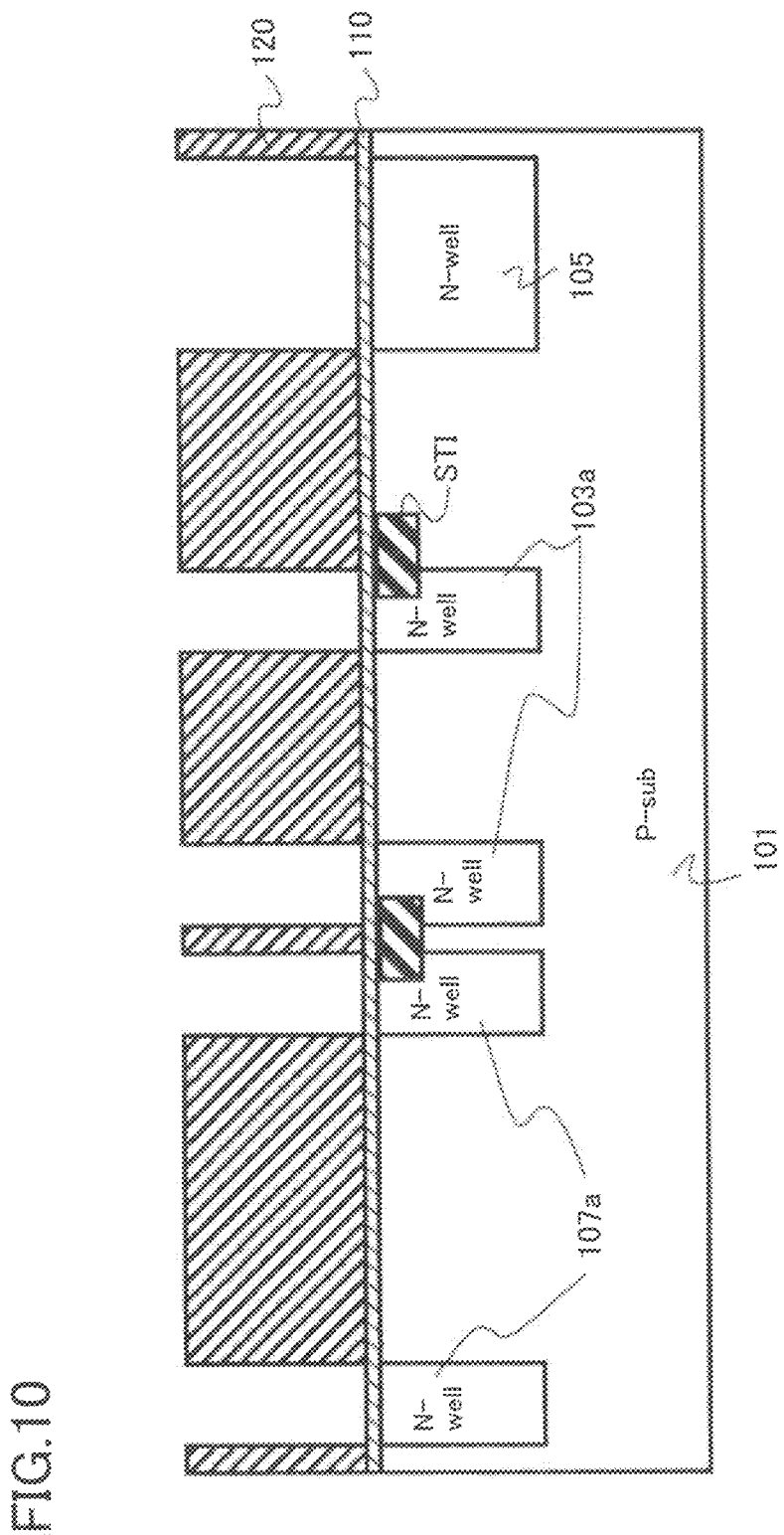
FIG. 10 is a schematic cross-sectional view of a non-volatile semiconductor memory device manufacturing method according to the embodiment.

First, as illustrated in FIG. 10, device isolating regions STI and a sacrificial oxide film 110 are formed on the p-type semiconductor substrate (P-sub) 101. Next, a photoresist film 120 is coated on the sacrificial oxide film 110. Next, according to a photolithography method, openings matching the side regions (N-well) 103a of the first N well 103, the second N well (N-well) 105 and the side regions 107a of the third N well (N-well) 107 are formed in the photoresist film 120. Then, impurities such as phosphorus or arsenic for forming the side regions 103a of the first N well 103, the second N well 105 and the side regions 107a of the third N well 107 are ion-implanted in the semiconductor substrate 101, using the photoresist film 120 as a mask.

Thus, the side regions 103a of the first N well 103, the second N well 105 and the third N well 107 are simultaneously formed. Hence, the depths of the side regions 103a of the first N well 103, the second N well 105 and the third N well 107 are the same.

Figure 11:
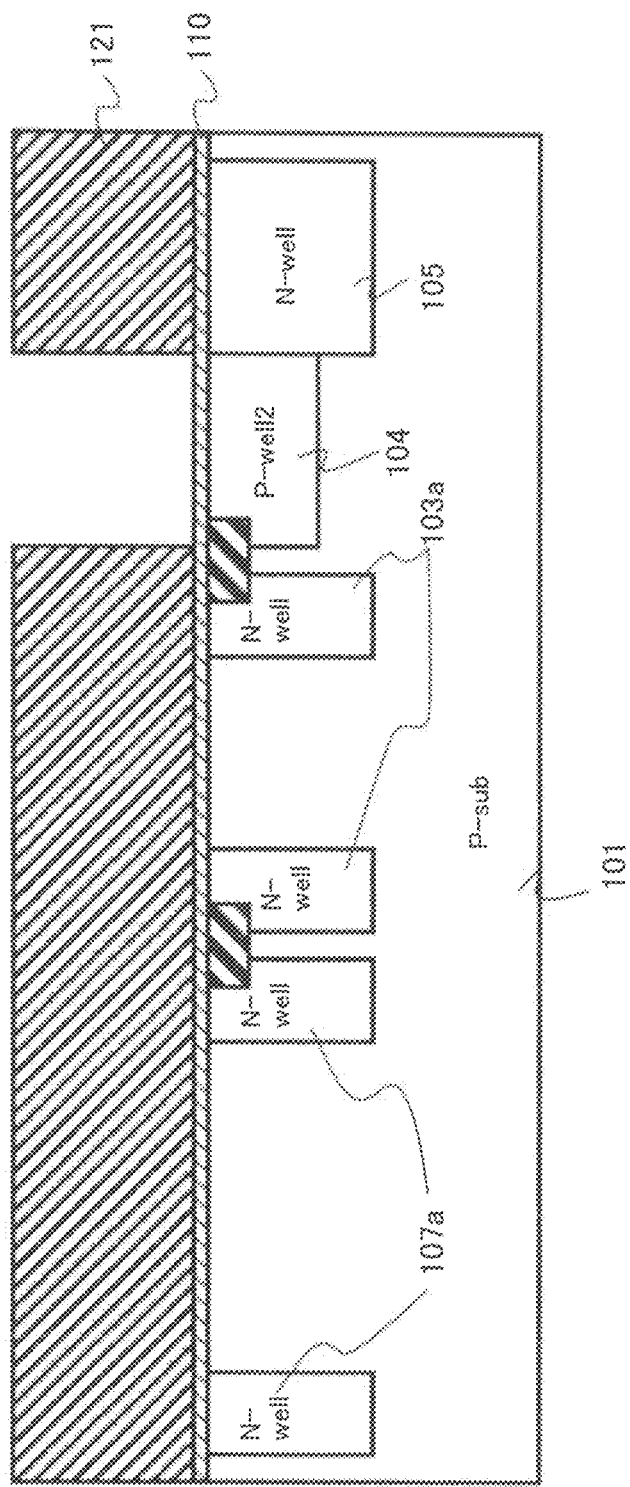
FIG. 11 is a schematic cross-sectional view of the non-volatile semiconductor memory device manufacturing method according to the embodiment.

Next, as illustrated in FIG. 11, after the photoresist film 120 is peeled off, a photoresist film 121 is coated on the sacrificial oxide film 110. Next, according to the photolithography method, an opening matching the second P well (P-well2) 104 is formed in the photoresist film 121. Then, an impurity such as boron for forming the second P well 104 is ion-implanted in the semiconductor substrate 101, using the photoresist film 121 as a mask.

Figure 12:
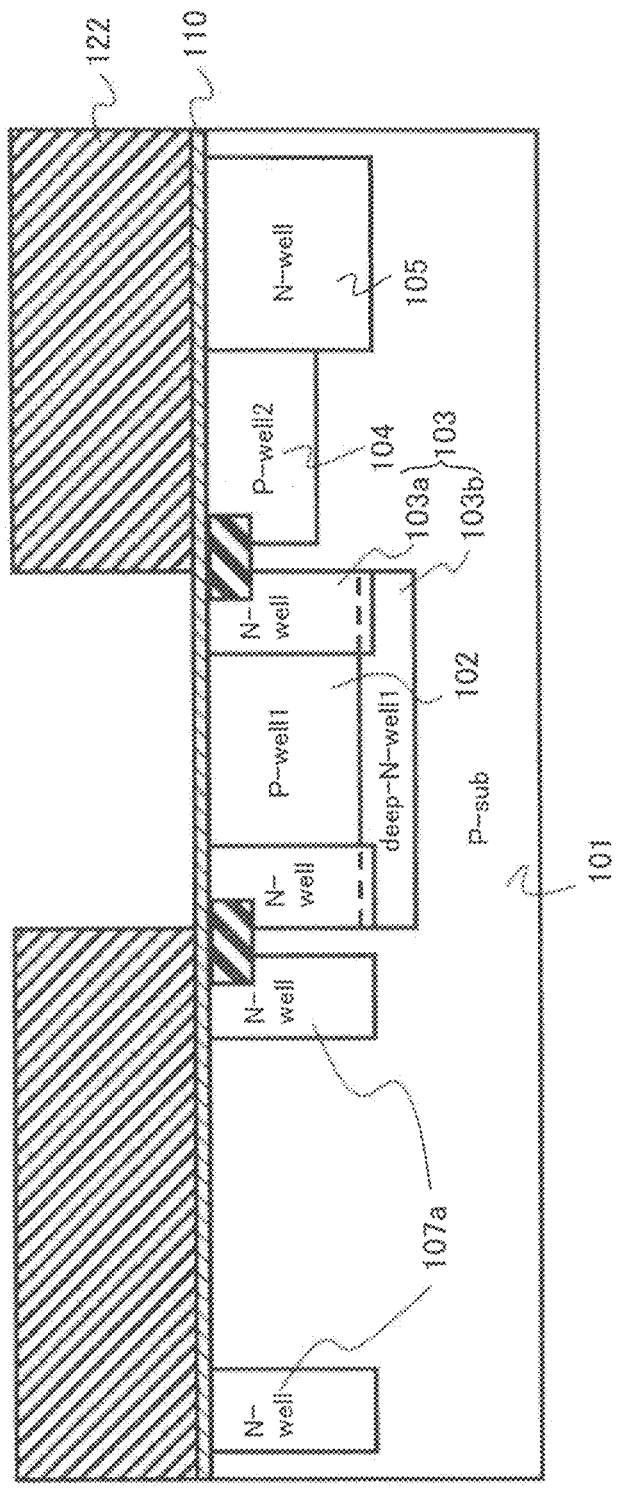
FIG. 12 is a schematic cross-sectional view of the non-volatile semiconductor memory device manufacturing method according to the embodiment.

Next, as illustrated in FIG. 12, after the photoresist film 121 is peeled off, a photoresist film 122 is coated on the sacrificial oxide film 110. Next, according to the photolithography method, an opening matching the first P well 102 (P-well1) is formed in the photoresist film 122. Then, an impurity such as phosphorus or arsenic for forming the bottom region (deep-N-well1) 103b of the first N well 103 is ion-implanted in the semiconductor substrate 101, using the photoresist film 122 as a mask. Subsequently, an impurity such as boron for forming the first P well 102 is ion-implanted in the semiconductor substrate 101, using the photoresist film 122 as a mask.

Thus, the first P well 102 and the bottom region 103b of the first N well 103 are formed using the single photoresist film 122 as a mask.

Figure 13:
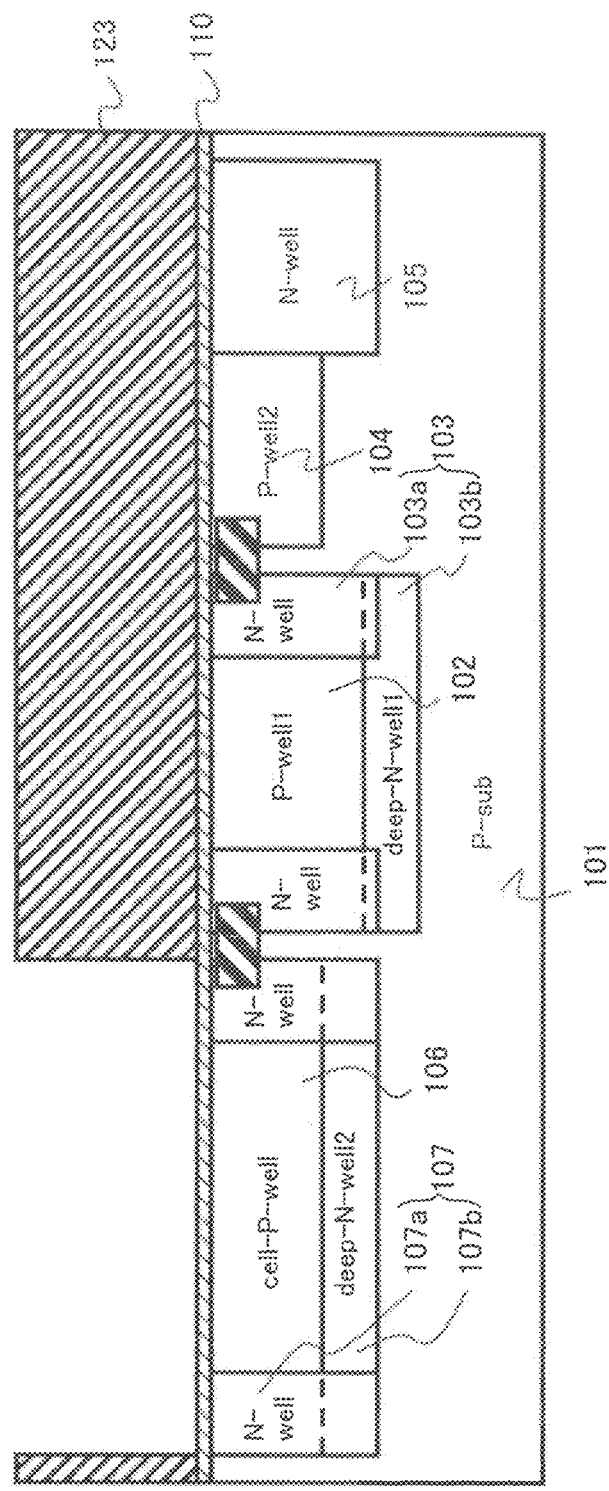
FIG. 13 is a schematic cross-sectional view of the non-volatile semiconductor memory device manufacturing method according to the embodiment.

Next, as illustrated in FIG. 13, after the photoresist film 122 is peeled off, a photoresist film 123 is coated on the sacrificial oxide film 110. Next, according to the photolithography method, an opening matching the cell P well 106 (cell-P-well) is formed in the photoresist film 123. Then, an impurity such as phosphorus or arsenic for forming the bottom region (deep-N-well2) 107b of the third N well 107 is ion-implanted in the semiconductor substrate 101, using the photoresist film 123 as a mask. Subsequently, an impurity such as boron for forming the cell P well 106 is ion-implanted in the semiconductor substrate 101, using the photoresist film 123 as a mask.

Thus, the cell P well 106 and the bottom region 107b of the third N well 107 are formed using the single photoresist film 123 as a mask.

Then, according to, for example, a known manufacturing method, devices such as the bit line connecting transistor $HT_k$, an n-type transistor SAn of the sense amplifier, the p-type transistor SAp of the sense amplifier and the memory cell transistors $MT_1$ and $MT_2$ are formed.

The semiconductor memory device manufacturing method according to the embodiment simplifies manufacturing process by simultaneously forming the side regions 103a of the first N well 103, the second N well 105 and the third N well 107. Further, the manufacturing process is simplified by forming the first P well 102 and the bottom region 103b of the first N well 103 using the single photoresist film 122 as a mask. Furthermore, the manufacturing process is simplified by forming the cell P well 106 and the bottom region 107b of the third N well 107 using the single photoresist film 123 as a mask.

As described above, according to the embodiment, it is possible to provide a non-volatile semiconductor memory device which can scale down the bit line connecting unit.

While certain embodiments have been described, these embodiments have been presented by way of example only, and are not intended to limit the scope of the inventions. Indeed, the non-volatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a p-type semiconductor substrate;
   a memory cell array having memory cells and a select gate transistor;
   a sense amplifier unit;
   a bit line connecting transistor provided between the memory cell array and the sense amplifier unit, the bit line connecting transistor connecting a bit line of the memory cells and the sense amplifier unit;
   a p-type first P well formed in the semiconductor substrate, the bit line connecting transistor being formed at the first P well; and
   an n-type first N well surrounding the first P well, the n-type first N well being configured to electrically isolate the first P well from the semiconductor substrate.

2. The device according to claim 1, wherein an impurity concentration of the first P well is higher than an impurity concentration of the semiconductor substrate.

3. The device according to claim 1, further comprising a p-type second P well in the semiconductor substrate, the second P well being formed spaced apart from the first P well and a transistor of the sense amplifier unit being formed at the second P well,
   wherein an impurity concentration of the first P well is lower than an impurity concentration of the second P well, and a depth of the first P well is deeper than the second P well.

4. The device according to claim 1, wherein a potential of the first P well is less than 0 V when data in the memory cells are read or when data are written in the memory cells.

5. The device according to claim 1, wherein a potential of the first P well is 0 V or more when data in the memory cells are erased.

6. The device according to claim 1, wherein the bit line connecting transistor comprises asymmetrical source/drain regions, and one of the source/drain regions comprises a LDD (Lightly Doped Drain) structure.

7. The device according to claim 6, wherein other one of the source/drain regions of the bit line connecting transistor comprises a DDD (Double Diffused Drain) structure.

8. The device according to claim 1, further comprising:
   a p-type cell P well being formed spaced apart from the first P well in the semiconductor substrate, transistors of the memory cells being formed at the cell P well; and
   an n-type second N well surrounds the cell P well, the second N well being configured to electrically isolate the cell P well from the semiconductor substrate,
   wherein an impurity concentration of the first P well is lower than an impurity concentration of the cell P well, and a depth of the first P well is deeper than the cell P well.

9. The device according to claim 3, further comprising:
   a p-type cell P well formed spaced apart from the first P well in the semiconductor substrate, transistors of the memory cells being formed at the cell P well; and
   an n-type second N well surrounding the cell P well, the second N well being configured to electrically isolate the cell P well from the semiconductor substrate,
   wherein an impurity concentration of the first P well is lower than an impurity concentration of the cell P well, and a depth of the first P well is deeper than the cell P well.

10. The device according to claim 1, further comprising a well potential control unit, the well potential control unit being configured to control a potential of the first P well according to an operation of reading data in the memory cells, an operation of writing data in the memory cells or an operation of erasing data from the memory cells.

* * * * *